US011981989B2

(12) United States Patent
Hartwig et al.

(10) Patent No.: US 11,981,989 B2
(45) Date of Patent: May 14, 2024

(54) AUTOMATED TEMPERATURE CONTROLLED SUBSTRATE SUPPORT

(71) Applicant: Applied Materials, Inc., Santa Clara, CA (US)

(72) Inventors: Robert Hartwig, San Jose, CA (US); Dinkesh Huderi Somanna, San Jose, CA (US); Brian T. West, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 498 days.

(21) Appl. No.: 17/337,528

(22) Filed: Jun. 3, 2021

(65) Prior Publication Data

US 2022/0389566 A1    Dec. 8, 2022

(51) Int. Cl.
| | |
|---|---|
| *C23C 14/54* | (2006.01) |
| *C23C 14/34* | (2006.01) |
| *C23C 14/50* | (2006.01) |
| *F28F 27/02* | (2006.01) |
| *H01J 37/32* | (2006.01) |

(52) U.S. Cl.
CPC ............ *C23C 14/541* (2013.01); *C23C 14/34* (2013.01); *C23C 14/50* (2013.01); *F28F 27/02* (2013.01); *H01J 37/32724* (2013.01); *H01J 2237/002* (2013.01); *H01J 2237/332* (2013.01)

(58) Field of Classification Search
None
See application file for complete search history.

(56) References Cited

U.S. PATENT DOCUMENTS

| | | |
|---|---|---|
| 9,681,497 B2 | 6/2017 | Nangoy et al. |
| 2009/0114158 A1 | 5/2009 | Zucker et al. |
| 2011/0033638 A1* | 2/2011 | Ponnekanti ............. C23C 16/52 |
| | | 118/723 E |

(Continued)

FOREIGN PATENT DOCUMENTS

| | | |
|---|---|---|
| JP | 2019-169549 A | 10/2019 |
| JP | 2021-034516 A | 3/2021 |

OTHER PUBLICATIONS

PCT International Search Report and Written Opinion for PCT/US2022/028280 dated Aug. 26, 2022.

*Primary Examiner* — Jason Berman
(74) *Attorney, Agent, or Firm* — MOSER TABOA

(57) ABSTRACT

Methods and apparatus for processing a substrate are provided herein. For example, a cooling apparatus for use with a substrate support of a processing chamber comprises a heat exchanger, a manifold assembly comprising a first input configured to connect to an output of the heat exchanger, a second input configured to connect to a first coolant supply configured to supply a first coolant, a first output configured to connect to the substrate support of the processing chamber, and a second output configured to connect to an input of the heat exchanger, a gas input configured to connect to a second coolant supply that is configured to supply a second coolant that is different from the first coolant to the substrate support, a first three-way valve connected between the first output of the manifold assembly and the substrate support and connected between the gas input and the substrate support, and a controller configured to control supplying one of the first coolant or the second coolant during operation.

20 Claims, 3 Drawing Sheets

(56) References Cited

U.S. PATENT DOCUMENTS

| | | |
|---|---|---|
| 2015/0060013 A1 | 3/2015 | Buchberger, Jr. |
| 2015/0211122 A1* | 7/2015 | Chang ................. C23C 16/4586 |
| | | 118/725 |
| 2017/0323813 A1 | 11/2017 | Silveira et al. |
| 2019/0115240 A1 | 4/2019 | Kim et al. |
| 2019/0214279 A1* | 7/2019 | Marcacci .......... H01L 21/67248 |
| 2019/0341288 A1* | 11/2019 | Che ................... H01L 21/67069 |
| 2019/0385828 A1 | 12/2019 | Singhal et al. |
| 2021/0151300 A1* | 5/2021 | Jung ................. H01J 37/32724 |

* cited by examiner

AUTOMATED TEMPERATURE CONTROLLED SUBSTRATE SUPPORT

FIELD

Embodiments of the present disclosure generally relate to plasma processing chambers, and more particularly, to plasma processing chambers including an automated temperature-controlled substrate support.

BACKGROUND

Plasma processing chambers comprising temperature-controlled substrate supports (e.g., wafer pedestal) are known. For example, during operation, a substrate support can be heated and/or cooled using one or more heating devices (e.g., resistive heaters) and cooling devices (e.g., coolant channels configured to receive one or more coolants). For example, with respect to cooling devices, a controller of a plasma processing chamber can be configured to provide one or more coolants to coolant channels disposed on/in the substrate support. In some instances, however, if a user wants to change between hot or cool operation of the substrate support and needs to change the coolant (e.g., to or from gas coolant), manual hardware changes are required, which can be time consuming and reduce throughput. Additionally, if a user wants to change a gas coolant to, for example, deionized (DI) water, to cool a hot substrate support (e.g., wafer pedestal/electrostatic chuck (ESC)), the DI water can cause sufficient thermal stress to the substrate support which can cause the substrate support to crack. Moreover, introducing DI water to a hot substrate support can cause flash vaporizing of the DI water which can potentially rupture feed hoses connected to the coolant channels of the substrate support, thus releasing superheated steam and/or boiling water into an operational environment and/or into a processing volume of the plasma processing chamber.

SUMMARY

Methods and apparatus for processing a substrate are provided herein. In some embodiments, a cooling apparatus for use with a substrate support of a processing chamber comprises a heat exchanger, a manifold assembly comprising a first input, configured to connect to an output of the heat exchanger, a second input configured to connect to a first coolant supply configured to supply a first coolant, a first output configured to connect to the substrate support of the processing chamber, and a second output configured to connect to an input of the heat exchanger, a gas input configured to connect to a second coolant supply that is configured to supply a second coolant that is different from the first coolant to the substrate support, a first three-way valve connected between the first output of the manifold assembly and the substrate support and connected between the gas input and the substrate support, and a controller configured to control supplying one of the first coolant or the second coolant during operation.

In accordance with at least some embodiments, a temperature-controlled substrate support comprises a substrate support configured to support a substrate in a processing chamber, the substrate support comprising a plurality of coolant lines configured to flow coolant therethrough during operation, a cooling apparatus connected to the plurality of coolant lines of the substrate support and comprising a heat exchanger, a manifold assembly comprising a first input connected to an output of the heat exchanger, a second input connected to a first coolant supply that supplies a first coolant, a first output connected to the substrate support of the processing chamber, and a second output connected to an input of the heat exchanger, a gas input connected to a second coolant supply that supplies a second coolant that is different from the first coolant to the substrate support, a first three-way valve connected between the first output of the manifold assembly and the substrate support and connected between the gas input and the substrate support, and a controller configured to control supplying one of the first coolant or the second coolant during operation.

In accordance with at least some embodiments, a method for processing a substrate comprises processing the substrate disposed on a substrate support, supplying a first coolant to the substrate support via coolant supply lines connected to the substrate support, determining a temperature of at least one of the substrate or the substrate support, supplying a second coolant to the substrate support via the coolant supply lines used for supplying the first coolant based on a determined temperature, the second coolant different from the first coolant, and continuing processing the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
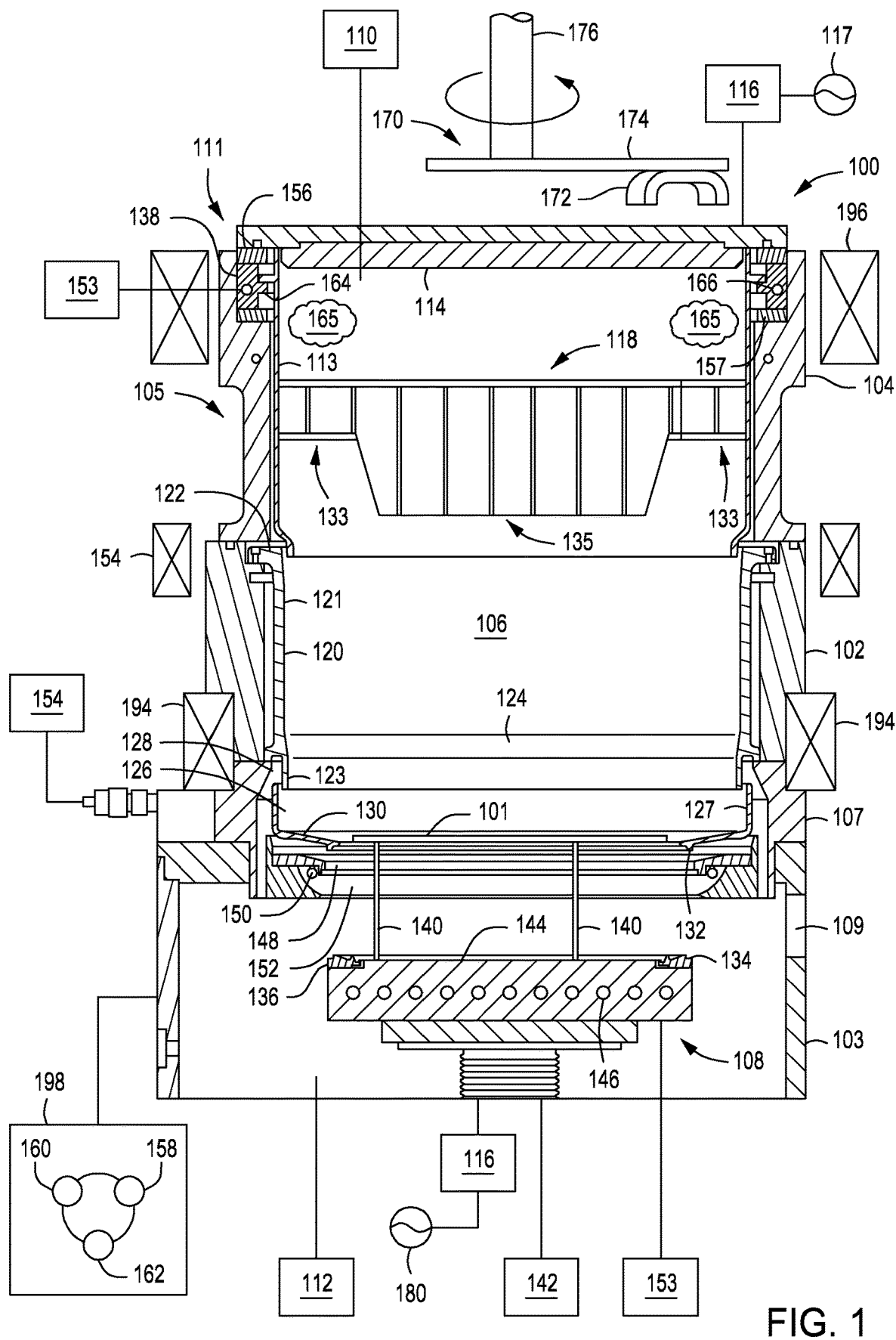
FIG. 1 is a schematic cross-sectional view of a processing chamber, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of plasma processing chambers and methods of use thereof including an automated temperature-controlled substrate support are provided herein. For example, cooling apparatus for use with a substrate support of a processing chamber can comprise a heat exchanger, a manifold assembly comprising a first input configured to connect to an output of the heat exchanger, a second input configured to connect to a first coolant supply configured to supply a first coolant, a first output configured to connect to the substrate support of the processing chamber, and a second output configured to connect to an input of the heat exchanger, a gas input configured to connect to a second coolant supply that is configured to supply a second coolant that is different from the first coolant to the substrate support, a first three-way valve connected between the first output of the manifold assembly and the substrate support and connected between the gas input and the substrate support, and a controller configured to control supplying one of the first coolant or the second coolant during operation. The cooling apparatus and methods of use thereof herein described provide a user with the ability to change between hot or cool operation of a substrate support manually or automatically without hardware changes being needed. Additionally, the cooling apparatus and methods of use thereof herein described provide a user with the ability to change between a gas coolant to, for example, deionized (DI) water manually or automatically to cool a hot substrate support (e.g., wafer pedestal/electrostatic chuck (ESC)), without the risk of introducing thermal stress to the substrate support and/or causing flash vaporizing of the DI water.

FIG. 1 depicts a schematic side view of a processing chamber 100 (e.g., a plasma processing chamber) including a cooling apparatus, in accordance with at least some embodiments of the present disclosure. In some embodiments, the processing chamber 100 is a PVD processing chamber suitable for sputter depositing materials on a substrate having a given diameter. Illustrative examples of suitable PVD chambers that may be adapted to benefit from the present disclosure include those commercially available from Applied Materials, Inc., of Santa Clara, California. Other processing chambers available from Applied Materials, Inc. as well as other manufacturers may also be adapted in accordance with the embodiments described herein.

The processing chamber 100 generally includes an upper sidewall 102, a lower sidewall 103, a ground adapter 104, and a lid assembly 111 defining a body 105 that encloses an interior volume 106. An adapter plate 107 may be disposed between the upper sidewall 102 and the lower sidewall 103.

A substrate support 108 is disposed in the interior volume 106 of the processing chamber 100. The substrate support 108 is configured to support a substrate having a given diameter (e.g., 150 mm, 200 mm, 300 mm, 450 mm, or the like). A substrate transfer port 109 is formed in the lower sidewall 103 for transferring substrates into and out of the interior volume 106.

A gas source 110 is coupled to the processing chamber 100 to supply process gases into the interior volume 106. In some embodiments, process gases may include inert gases, non-reactive gases, and reactive gases, if necessary. Examples of process gases that may be provided by the gas source 110 include, but are not limited to, argon gas (Ar), helium (He), neon gas (Ne), nitrogen gas ($N_2$), oxygen gas ($O_2$), and water ($H_2O$) vapor, among others.

A pumping device 112 is coupled to the processing chamber 100 in communication with the interior volume 106 to control the pressure of the interior volume 106. During deposition, the pressure level of the processing chamber 100 may be maintained from about 1 mTorr to about 1 Torr, e.g., from about 300 mTorr to about 500 mTorr.

The ground adapter 104 may support a target, such as a target 114. The target 114 is fabricated from a material to be deposited on the substrate. In some embodiments, the target 114 may be fabricated from aluminum (Al), cobalt (Co), copper (Cu), nickel (Ni), tantalum (Ta), titanium (Ti), tungsten (W), alloys thereof, combinations thereof, or the like. In some embodiments, the processing chamber 100 is configured to deposit, for example, aluminum oxide ($AlO_2$), aluminum oxynitride (such as ALON), Co, Cu, Ta, tantalum nitride (TaN), tantalum oxynitride (TaOxNy), Ti, titanium oxynitride (TiOxNy), W, or tungsten nitride (WN) on a substrate.

The target 114 may be coupled to a source assembly comprising a power supply 117 for the target 114. In some embodiments, the power supply 117 may be an RF power supply, which may be coupled to the target 114 via a matching network 116. In some embodiments, the power supply 117 may alternatively be a DC power supply, in which case the matching network 116 is omitted. In some embodiments, the power supply 117 may include both DC and RF power sources.

A magnetron 170 is positioned above the target 114 and may include a plurality of magnets 172 supported by a base plate 174 connected to a shaft 176, which may be axially aligned with the central axis of the processing chamber 100 and the substrate 101. The magnets 172 produce a magnetic field within the processing chamber 100 near the front face of the target 114 to generate a plasma 165 so a significant flux of ions strike the target 114, causing sputter emission of target material. The magnets 172 may be rotated about the shaft 176 to increase uniformity of the magnetic field across the surface of the target 114. In general, magnets 172 may be rotated such that the innermost magnet position during rotation of the magnets 172 is disposed above or outside of the diameter of the substrate being processed (e.g., the distance from the axis of rotation to the innermost position of the magnets 172 is equal to or greater than the diameter of the substrate being processed).

A collimator 118 can be positioned in the interior volume 106 between the target 114 and the substrate support 108. A central region 135 of the collimator 118 generally corresponds to the diameter of the substrate being processed (e.g., is equal to or substantially equal to the diameter of the substrate). Thus, a peripheral region 133 of the collimator 118 generally corresponds to an annular region radially outward of the substrate being processed (e.g., the inner diameter of the peripheral region 133 is substantially equal to or greater than the diameter of the substrate). In some embodiments, the collimator 118 may be electrically biased to control ion flux to the substrate and neutral angular distribution at the substrate, as well as to increase the deposition rate due to the added DC bias.

The collimator 118 is coupled to an upper shield 113, which in turn is coupled to the process tool adapter 138. The process tool adapter 138 may be made from suitable conductive materials compatible with processing conditions in the processing chamber 100. An insulator ring 156 and an insulator ring 157 are disposed on either side of the process tool adapter 138 to electrically isolate the process tool adapter 138 from the ground adapter 104. The insulator rings 156, 157 may be made from suitable process compatible dielectric materials.

In some embodiments, a first set of magnets 196 may be disposed adjacent to the ground adapter 104 to assist with generating the magnetic field to guide dislodged ions from the target 114 through the peripheral region 133. In some embodiments, a second set of magnets 194 may be disposed in a position to form a magnetic field between the bottom of the collimator 118 and the substrate to guide the metallic ions dislodged from the target 114 and distribute the ions more uniformly over the substrate 101. In some embodiments, a third set of magnets 154 may be disposed between the first and second set of magnets 196, 194 and about centered with or below a substrate-facing surface of the central region 135 of the collimator 118 to further guide the metallic ions towards the center of the substrate 101.

The process tool adapter 138 includes one or more features to facilitate supporting a process tool within the interior volume 106, such as the collimator 118. For example, as shown in FIG. 1, the process tool adapter 138 includes a mounting ring, or shelf 164 that extends in a radially inward direction to support the upper shield 113.

In some embodiments, a coolant channel 166 may be provided in the process tool adapter 138 to facilitate flowing a coolant through the process tool adapter 138 to remove heat generated during processing. For example, the coolant channel 166 may be coupled to a cooling apparatus 153 (coolant source) to provide a suitable coolant, such as water (deionized water), nitrogen, argon, or other noble gas, clean dry air (CDA), or corrosive gas, etc. The coolant channel 166 advantageously removes heat from the process tool (e.g., collimator 118) that is not readily transferred to other cooled chamber components, such as the ground adapter 104.

A radially inwardly extending ledge (e.g., the mounting ring, or shelf 164) is provided to support the upper shield 113 within the central opening within the interior volume 106 of the processing chamber 100. In some embodiments the shelf 164 is disposed in a location proximate the coolant channel 166 to facilitate maximizing the heat transfer from the collimator 118 to the coolant flowing in the coolant channel 166 during use.

In some embodiments, a lower shield 120 may be provided in proximity to the collimator 118 and interior of the ground adapter 104 or the upper sidewall 102. The lower shield 120 may include a tubular body 121 having a radially outwardly extending flange 122 disposed in an upper surface of the tubular body 121. The flange 122 provides a mating interface with an upper surface of the upper sidewall 102. In some embodiments, the tubular body 121 of the lower shield 120 may include a shoulder region 123 having an inner diameter that is less than the inner diameter of the remainder of the tubular body 121. In some embodiments, the inner surface of the tubular body 121 transitions radially inward along a tapered surface 124 to an inner surface of the shoulder region 123. A shield ring 126 may be disposed in the processing chamber 100 adjacent to the lower shield 120 and intermediate of the lower shield 120 and the adapter plate 107. The shield ring 126 may be at least partially disposed in a recess 128 formed by an opposing side of the shoulder region 123 of the lower shield 120 and an interior sidewall of the adapter plate 107.

In some embodiments, the shield ring 126 may include an axially projecting annular sidewall 127 that has an inner diameter that is greater than an outer diameter of the shoulder region 123 of the lower shield 120. A radial flange 130 extends from the annular sidewall 127. The radial flange 130 includes a protrusion 132 formed on a lower surface of the radial flange 130. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recess 134 formed in an edge ring 136 disposed on the substrate support 108. The recess 134 may be a circular groove formed in the edge ring 136. The engagement of the protrusion 132 and the recess 134 centers the shield ring 126 with respect to the longitudinal axis of the substrate support 108. The substrate 101 (shown supported on lift pins 140) is centered relative to the longitudinal axis of the substrate support 108 by coordinated positioning calibration between the substrate support 108 and a robot blade (not shown).

An RF power source 180 may be coupled to the processing chamber 100 through the substrate support 108 to provide a bias power between the target 114 and the substrate support 108. In some embodiments, a match network (e.g., the matching network 116) can be coupled between the RF power source 180 and the substrate support 108. In some embodiments, the RF power source 180 may have a frequency between about 400 Hz and about 60 MHz, such as about 13.56 MHz. In some embodiments, the RF power source 180 provides an amplitude pulsing modulated phase-shift keying signal and provide RF power at the same frequency that the matching network 116 operates at, as will be described in greater detail below.

In operation, a robot blade (not shown) having the substrate 101 disposed thereon is extended through the substrate transfer port 109. The substrate support 108 may be lowered to allow the substrate 101 to be transferred to the lift pins 140 extending from the substrate support 108. Lifting and lowering of the substrate support 108 and/or the lift pins 140 may be controlled by a drive 142 coupled to the substrate support 108. The substrate 101 may be lowered onto a substrate receiving surface 144 of the substrate support 108. With the substrate 101 positioned on the substrate receiving surface 144 of the substrate support 108, sputter deposition may be performed on the substrate 101. The edge ring 136 may be electrically insulated from the substrate 101 during processing.

After sputter deposition, the substrate 101 may be elevated utilizing the lift pins 140 to a position that is spaced away from the substrate support 108. The elevated location may be proximate one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon.

After controlling the substrate 101 to a predetermined temperature, the substrate 101 is lowered to a position on the substrate receiving surface 144 of the substrate support 108. The substrate 101 may be rapidly cooled utilizing thermal control channels 146 in the substrate support 108 via conduction. For example, the cooling apparatus 153 can be connected to the substrate support 108 and be configured to provide one or more coolants to the substrate support. The substrate 101 may be removed from the processing chamber 100 through the substrate transfer port 109 for further processing.

A controller 198 is coupled to the processing chamber 100. The controller 198 includes a central processing unit 160, a memory 158, and support circuits 162. The controller 198 is utilized to control the process sequence, regulating the gas flows from the gas source 110 into the processing chamber 100 and controlling ion bombardment of the target 114. The central processing unit 160 may be of any form of a general-purpose computer processor that can be used in an industrial setting. The software routines (e.g., instructions) can be stored in the memory 158 (e.g., non-transitory computer readable storage medium), such as random-access memory, read only memory, floppy or hard disk drive, or other form of digital storage. The support circuits 162 are conventionally coupled to the central processing unit 160 and may comprise cache, clock circuits, input/output subsystems, power supplies, and the like. The software routines, when executed by the central processing unit 160, transform the central processing unit into a specific purpose computer that controls the processing chamber 100 such that the processes, including the substrate support 108 cooling processes disclosed below, are performed in accordance with embodiments of the present disclosure. The software routines may also be stored and/or executed by a second controller (not shown) that is located remotely from the processing chamber 100.

During processing, material is sputtered from the target 114 and deposited on the surface of the substrate 101. The target 114 and the substrate support 108 are biased relative to each other by the power supply 117 or the RF power source 180 to maintain a plasma formed from the process gases supplied by the gas source 110. The DC pulsed bias power applied to the collimator 118 also assists controlling ratio of the ions and neutrals passing through the collimator 118, advantageously enhancing the trench sidewall and bottom fill-up capability. The ions from the plasma are accelerated toward and strike the target 114, causing target material to be dislodged from the target 114. The dislodged target material and process gases forms a layer on the substrate 101 with desired compositions.

Figure 2:
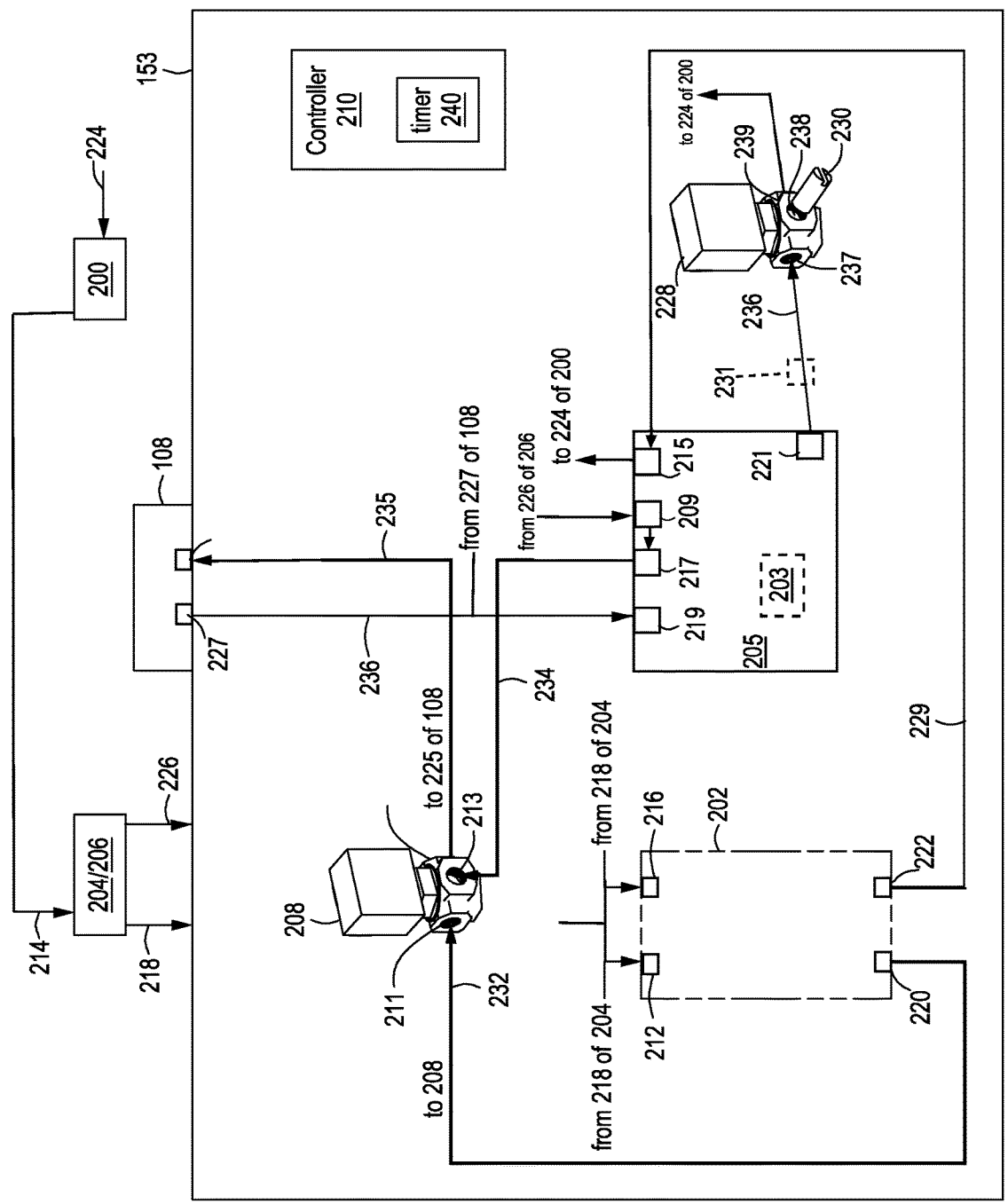
FIG. 2 is a diagram of a cooling apparatus configured for use with the processing chamber of FIG. 1, in accordance with at least some embodiments of the present disclosure.

FIG. 2 is a diagram of the cooling apparatus 153 configured for use with the processing chamber 100 of FIG. 1, in accordance with at least some embodiments of the present disclosure. For example, the cooling apparatus 153 comprises a heat exchanger 200, a manifold assembly 202 (e.g., such as a manifold assembly available from CKD corp.), a first coolant supply 204, a second coolant supply 206, a first three-way valve 208 (e.g., such as a three-way valve available from SMC corp.), a gas input 209, and a controller 210 (e.g., such as the controller 198).

The manifold assembly 202 comprises a first input 212 that is configured to connect to an output 218 of the first coolant supply 204, which connects to an output 214 of the heat exchanger 200, and a second input 216 that is also configured to connect to the output 218 of the first coolant supply 204. In at least some embodiments, a tee can be used to split the output 218 so that a single output can be used to supply the first coolant (e.g., deionized water) to the first input 212 and the second input 216. The manifold assembly 202 also comprises a first output 220 that is configured to connect via the first three-way valve 208 to the substrate support 108 of the processing chamber 100 and a second output 222 that is configured to connect to an input 224 of the heat exchanger 200 via a first coolant replenishment line 229, e.g., to replenish the first coolant in the heat exchanger 200. For example, the output 218 of the first coolant supply is connected to the second input 216 and outputted from the second output 222 of the manifold assembly 202, thus allowing the first coolant to be supplied to the heat exchanger 200 via the first coolant replenishment line 229.

A main hub 205 is disposed in the cooling apparatus 153 and comprises a plurality of inputs/outputs that are connected to the heat exchanger 200, the first coolant supply 204, a second coolant supply 206, and the first three-way valve 208. For example, the gas input 209 on the main hub 205 of the cooling apparatus 153 is configured to connect to an output 226 of the second coolant supply 206 that is configured to supply a second coolant (e.g., at least one of argon, nitrogen, other noble or inert gas, clean dry air (CDA)) via the first three-way valve 208 to the substrate support 108. In at least some embodiments, the second coolant is different from the first coolant. Additionally, an output 215 on the main hub 205 connects to the input 224 of the heat exchanger 200.

The first three-way valve 208 is connected between the first output 220 of the manifold assembly 202 and an input 225 of the substrate support 108 and is connected between the gas input 209 and the input 225 of the substrate support 108. For example, the first output 220 of the manifold assembly 202 is connected via a first coolant line input 232 to an input 211 of the first three-way valve 208 and the gas input 209 is connected via an output 217 to a second coolant line input 234 that connects to an input 213 of the first three-way valve 208. An output 233 of the first three-way valve 208 connects via a common coolant line input 235 to an input 225 of the substrate support 108.

In at least some embodiments, the cooling apparatus 153 can comprise a second three-way valve 228. For example, the second three-way valve 228 can be connected between an output 227 of the substrate support 108 and the input 224 of the heat exchanger 200. For example, a common coolant return line 236 connects from the output 227 of the substrate support 108 to an input 219 that connects to an output 221 which connects to an input 237 of the second three-way valve 228. The second three-way valve 228 can have a diffuser 230 connected to an output 238 of the second three-way valve 228 and configured for releasing the second coolant during operation (e.g., during purging of the first coolant line input 232). For example, the purging process can comprise purging the first coolant from the thermal control channels 146 within the substrate support 108, the second coolant line input 234, the common coolant line input 235, and the common coolant return line 236 to the diffuser 230 of the second three-way valve 228. In at least some embodiments, one or more additional diffusers can also be provided. For example, an additional diffuser 231 can be provided on the common coolant return line 236 prior to the input 237 of the second three-way valve 228 to facilitate the purging process. One or more suitable gases can be used during the purging process. For example, a purging gas can comprise argon, nitrogen, other noble or inert gas, CDA, etc. In at least some embodiments, the purging gas can be nitrogen. In at least some embodiments, the common coolant return line 236 can be connected to an output 239 of the second three-way valve 228 and can be connected to the first coolant replenishment line 229.

A timer 240 can be connected to the controller 210 (and/or the controller 198) and preset to provide a control signal to the controller 210 when the second coolant is changed to the first coolant. For example, in at least some embodiments, the preset time can be about 5 minutes to about 15 minutes, e.g., about 10 minutes.

The controller 210 is configured to control operation of the cooling apparatus 153 during operation. For example, the controller 210 can be connected to the controller 198 of the processing chamber 100 for receiving one or more command signals from the controller 198. The command signals correspond to supplying the first coolant, supplying the second coolant, and performing a purge of the first coolant prior to supplying the second coolant based on a determined temperature of a specific recipe used for substrate processing.

Figure 3:
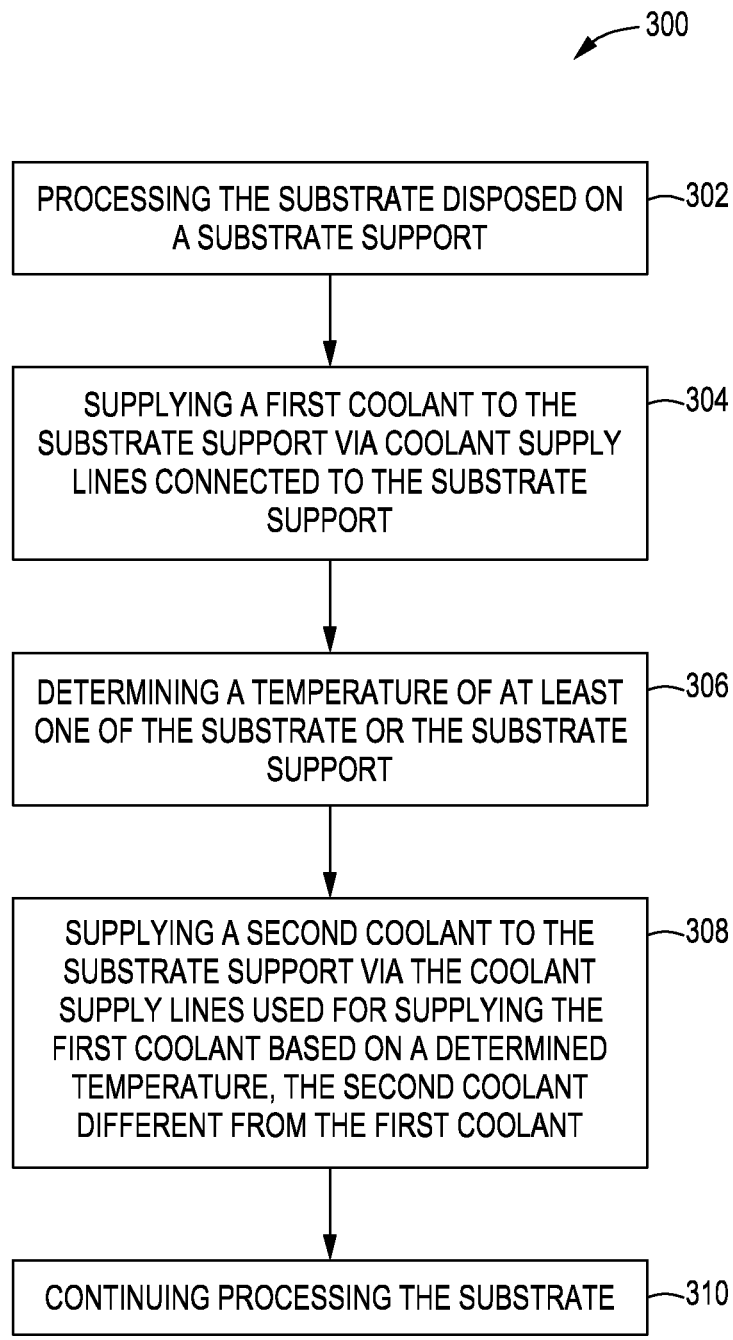
FIG. 3 is a flowchart of a method for processing a substrate, in accordance with at least some embodiments of the present disclosure.

FIG. 3 is a flowchart of a method 300 for processing a substrate, in accordance with at least some embodiments of the present disclosure. For example, at 302 the method 300 can comprise processing a substrate (e.g., the substrate 101) disposed on a substrate support (e.g., the substrate support 108). The substrate can be processed using one or more plasma processes, e.g., physical vapor deposition (PVD), etching, etc. For example, in at least some embodiments, one or more PVD processes can be performed on the substrate.

During plasma processing, at 304, the method 300 comprises supplying a first coolant to the substrate support via coolant supply lines connected to the substrate support. For example, when operating the substrate support 108 below 200° C., the cooling apparatus 153, under control of the controller 210 (and/or the controller 198) and based on a substrate processing recipe, supplies the first coolant to the substrate support 108. In at least some embodiments, the first coolant can be deionized water, other inert, high performance, dielectric heat transfer fluids (PFPE), such as the ones sold under the trademark Galden®, etc., which can be supplied to the thermal control channels 146 of the substrate support 108. For example, the controller 201 can transmit a control signal to the heat exchanger 200 and/or the first coolant supply 204. The control signal instructs the first coolant supply 204 to supply the first coolant to the first input 212 and the second input 216 of the manifold assembly 202. The first coolant is outputted via the first output 220 of the manifold assembly 202 to the input 211 of first three-way valve 208 and to the input 225 of the substrate support 108 so that the first coolant can flow through the thermal control channels 146 and cool the substrate support 108 and the substrate 101. Additionally, the first coolant can also be outputted from the second output 222 of the manifold assembly 202, e.g., to replenish the first coolant as needed. The first coolant can be returned to the heat exchanger 200 via the common coolant return line 236. In at least some embodiments, the common coolant return line 236 can be connected to the first coolant replenishment line 229 which connects to the output 215 of the main hub 205 which connects to the input 224 of the heat exchanger 200. Alternatively, the common coolant return line 236 can be directly connected to the input 224 of the heat exchanger 200. The purging process can be performed for a predetermined time, such as for about 5 minutes to about 15 minutes, e.g., 10 minutes. During 304, the controller 210 sends control signals to the first three-way valve 208 and the second three-way valve 228 (if used) to close the input 213 of the first three-way valve 208 and the output 238 of the second three-way valve 228.

The controller 210 can be configured to control supplying the first coolant and the second coolant based on a specific recipe requirement or based on a determined real-time temperature of a substrate support. For illustrative purposes, the method 300 is described herein with reference to the latter.

For example, next, at 306 the method 300 comprises determining a temperature of at least one of the substrate or the substrate support. For example, if a temperature of the substrate support 108 or the substrate 101 exceeds a predetermined value, e.g., 200° C., the controller 210 is configured to stop supplying the first coolant to the substrate support 108 and purge the first coolant from the common coolant line input 235, the thermal control channels 146, and the common coolant return line 236. For example, when the temperature of the substrate support 108 exceeds 200° C., the controller 210 sends a control signal to the heat exchanger 200 and/or the first coolant supply 204 to stop supplying the first coolant to the substrate support 108.

Next, the controller 210 sends a control signal to the second coolant supply 206 to supply one or more gases (e.g., nitrogen ($N_2$), CDA, etc.) to purge the first coolant from the common coolant line input 235, the thermal control channels 146, and the common coolant return line 236. During the purging process, the one or more gases used to purge the first coolant from the common coolant line input 235, the thermal control channels 146, and the common coolant return line 236 can be expelled through the diffuser 230 and/or the additional diffuser 231. Prior to expelling the second coolant through the diffuser 230 and/or the additional diffuser 231, the second coolant can pass through another heat exchanger 203 disposed within the main hub 205 of the cooling apparatus 153. Additionally, during the purging process, most of the first coolant can be returned to the heat exchanger 200 via the common coolant return line 236 (e.g., some of the first coolant may be expelled through the diffuser 230 and/or the additional diffuser 231.

Next, at 308, the method 300 comprises supplying a second coolant including, but not limited to, (nitrogen ($N_2$), argon (or other noble gas), CDA, or other inert gas, etc. to the substrate support via the coolant supply lines used for supplying the first coolant based on a determined temperature, the second coolant being different from the first coolant. For example, the controller 210 changes the valve configuration so that the second coolant can be supplied to the substrate support 108. For example, the input 213 and the output 238 of the first three-way valve and the second three-way valve 228, respectively, can be opened, while the input 211 and the output 239 of the first three-way valve and the second three-way valve 228, respectively, can be closed. During 308, the second coolant can pass through the heat exchanger 203 disposed within the main hub 205. The heat exchanger 203 is configured to cool the second coolant returning in the common coolant return line 236 so that the second coolant can be expelled through the diffuser 230 and/or the additional diffuser 231 into the atmosphere. For example, the heat exchanger 203 disposed can cool the second coolant from temperatures between about 100° C. and 250° C. to about −30° C. for safe release through the diffuser 230 and/or the additional diffuser 231.

Next, at 310 the method 300 comprises continuing processing the substrate. For example, the second coolant is supplied to the substrate support 108 until the temperature of the substrate support 108 falls below the predetermined temperature, e.g., 200° C., or until the recipe calls for heating the substrate to about 200° C. or less. Again, the controller 210 can be configured to wait a predetermined time before changing from the second coolant to the first coolant, such as about 5 minutes to about 15 minutes, e.g., 10 minutes.

While the foregoing is directed to embodiments of the present disclosure, other and further embodiments of the disclosure may be devised without departing from the basic scope thereof.

The invention claimed is:
1. A cooling apparatus for use with a substrate support of a processing chamber, comprising:
   a heat exchanger;
   a manifold assembly comprising a first input configured to connect to an output of the heat exchanger, a second input configured to connect to a first coolant supply configured to supply a first coolant, a first output configured to connect to the substrate support of the processing chamber, and a second output configured to connect to an input of the heat exchanger;
   a gas input configured to connect to a second coolant supply that is configured to supply a second coolant that is different from the first coolant to the substrate support;
   a first three-way valve comprising a first input connected to the first output of the manifold assembly for receiving the first coolant, a second input connected to the gas input for receiving the second coolant, and a common output that supplies the first coolant and the second coolant to the substrate support; and a controller configured to control supplying one of the first coolant or the second coolant during operation.

2. The cooling apparatus of claim 1, wherein the first coolant is deionized water.

3. The cooling apparatus of claim 1, wherein the second coolant is at least one of argon, nitrogen, or clean dry air.

4. The cooling apparatus of claim 1, wherein the first three-way valve is connected to the second input of the manifold assembly.

5. The cooling apparatus of claim 1, further comprising a second three-way valve connected between an output of the substrate support and the input of the heat exchanger.

6. The cooling apparatus of claim 5, wherein the second three-way valve comprises a diffuser for releasing the second coolant during purging of a coolant line connected to the substrate support.

7. The cooling apparatus of claim 6, further comprising a timer connected to the controller and preset to provide a control signal to the controller when the second coolant is changed to the first coolant.

8. A temperature-controlled substrate support, comprising:
   a substrate support configured to support a substrate in a processing chamber, the substrate support comprising a plurality of coolant lines configured to flow coolant therethrough during operation;
   a cooling apparatus connected to the plurality of coolant lines of the substrate support and comprising:
   a heat exchanger;
   a manifold assembly comprising a first input connected to an output of the heat exchanger, a second input connected to a first coolant supply that supplies a first coolant, a first output connected to the substrate support of the processing chamber, and a second output connected to an input of the heat exchanger;
   a gas input connected to a second coolant supply that supplies a second coolant that is different from the first coolant to the substrate support;
   a first three-way valve comprising a first input connected to the first output of the manifold assembly for receiving the first coolant, a second input connected to the gas input for receiving the second coolant, and a common output that supplies the first coolant and the second coolant to the substrate support; and
   a controller configured to control supplying one of the first coolant or the second coolant during operation.

9. The temperature-controlled substrate support of claim 8, wherein the first coolant is deionized water.

10. The temperature-controlled substrate support of claim 8, wherein the second coolant is at least one of argon, nitrogen, or clean dry air.

11. The temperature-controlled substrate support of claim 8, wherein the first three-way valve is connected to the second input of the manifold assembly.

12. The temperature-controlled substrate support of claim 8, further comprising a second three-way valve connected between an output of the substrate support and the input of the heat exchanger.

13. The temperature-controlled substrate support of claim 12, wherein the second three-way valve comprises a diffuser for releasing the second coolant during purging of the plurality of coolant lines connected to the substrate support.

14. The temperature-controlled substrate support of claim 13, further comprising a timer connected to the controller and preset to provide a control signal to the controller when the second coolant is changed to the first coolant.

15. A method for processing a substrate, comprising:
   processing the substrate disposed on a substrate support;
   supplying a first coolant, via a three-way valve, to the substrate support via coolant supply lines connected to the substrate support;
   determining a temperature of at least one of the substrate or the substrate support;
   supplying a second coolant, via the three-way valve, to the substrate support via the coolant supply lines used for supplying the first coolant based on a determined temperature, the second coolant different from the first coolant; and
   continuing processing the substrate.

16. The method of claim 15, wherein supplying the first coolant comprises supplying deionized water.

17. The method of claim 15, wherein supplying the second coolant comprises supplying at least one of argon, nitrogen, or clean dry air.

18. The method of claim 15, further comprising, when the determined temperature is equal to or greater than a first predetermined value, purging the coolant supply lines using at least one of argon, nitrogen, or clean dry air, wherein the first predetermined value is about 200° C.

19. The method of claim 15, further comprising, when the determined temperature is less than a first predetermined value, stopping supplying the first coolant to the substrate support for a predetermined time, wherein the first predetermined value is about 200° C.

20. The method of claim 19, wherein the predetermined time is about 5 minutes to about 10 minutes.

* * * * *